Jan. 23, 1962 D. D. HOLMES 3,018,369

TRANSISTORIZED DIRECTION FINDER RECEIVER HAVING A LOCAL AUDIO SIGNAL MODULATED ON THE MIXER

Filed March 12, 1958

INVENTOR.

DAVID D. HOLMES

BY J. L. Whittaker

ATTORNEY

United States Patent Office 3,018,369 Patented Jan. 23, 1962

3,018,369

TRANSISTORIZED DIRECTION FINDER RECEIVER HAVING A LOCAL AUDIO SIGNAL MODULATED ON THE MIXER

David D. Holmes, Stony Brook, N.Y., assignor to Radio Corporation of America, a corporation of Delaware
Filed Mar. 12, 1958, Ser. No. 720,856
9 Claims. (Cl. 250—8)

Figure 1:
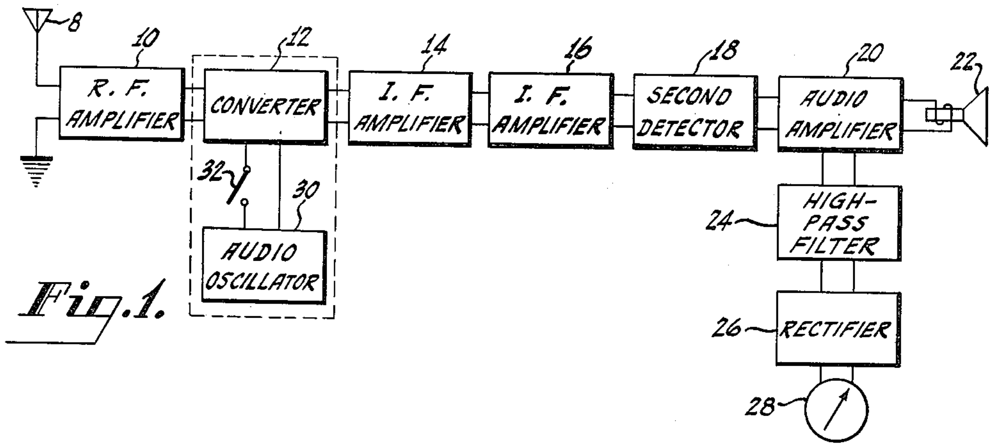

This invention relates in general to radio signal receiving systems, and in particular to improved receiving systems utilizing transistors as active circuit element.

In radio receivers such as those used for communication or direction finding purposes for example, it is customary to provide a beat frequency oscillator or BFO. The beat-frequency oscillator is ordinarily used in communication receivers to provide an audio output or tone signal corresponding to the periodic radio-frequency carrier interruptions which form code C-W signals. In addition, the BFO in direction finder receivers operates to provide an audio output signal proportional to the strength of the radio-frequency carrier signal at the receiver antenna. Thus, the audio output signal can be used for null-detection purposes.

In conventional receivers of the superheterodyne type, the BFO generally comprises an oscillator which operates at the intermediate-frequency of the receiver plus-or-minus an audio frequency difference. In a superheterodyne receiver having the commonly used 455 kilocycle intermediate-frequency, the BFO might operate at 455 kilocycles plus one kilocycle, or 456 kilocycles, for example. The output signal of the BFO is normally coupled to an intermediate-frequency or IF amplifier. Both the intermediate-frequency signal and the BFO signal are then fed to the second-detector of the receiver where beating occurs and a one kilocycle audio signal is produced. This signal is then normally applied to the audio amplifier of the receiver and thereupon appears as an audio tone at the output. If the BFO signal amplitude is made large compared to the amplitude of the intermediate-frequency signal, the amplitude of the audio difference signal will vary in proportion to the amplitude of the IF signal, and can then be used for null detection purposes in a direction finder receiver. Therefore, when a beat-frequency oscillator is coupled into the IF stage of a superheterodyne receiver, the oscillator signal amplitude must be large compared to the IF signal amplitude in order that the resulting difference signal can be used for direction finding purposes.

It is difficult to use such a BFO system in a transistor receiver. The difficulty arises chiefly because of the high level of the IF signal required at the transistor receiver second-detector input relative to the battery voltage and also due to the relatively limited dynamic range of the second-detector. If a BFO signal large in amplitude compared to the IF signal amplitude is introduced at the second-detector of a transistor receiver to vary the IF signal amplitude several times the battery voltage, it is difficult to keep such a signal from being fed back into a preceding IF stage and overloading the amplifier.

Another system employs audio modulation of the radio-frequency heterodyne or local oscillator. Such a system has the disadvantages of poor operating efficiency and critical adjustment for proper operation. In this system, the audio modulated local oscillator signal is applied to a mixer stage. However, in a mixer stage, the amplitude of the intermediate-frequency output signal is normally independent of the local oscillator signal injection amplitude. Therefore, to transfer the audio modulation from the local oscillator to the intermediate-frequency output signal, the mixer must operate very inefficiently, and the amplitude of the injected local oscillator signal becomes critical, thereby providing unstable circuit operation.

Other means must therefore be found in a transistor receiver for providing an audio tone responsive to an R.F. carrier signal and at the same time making the receiver suitable for null detection purposes, as is required in direction finder receivers.

It is accordingly an object of the present invention to provide an improved transistor signal receiver.

It is another object of the present invention to provide an improved transistor signal receiver utilizing an audio tone generator for receiving C-W signals.

It is yet another object of the present invention to provide an improved superheterodyne receiver responsive to C-W signals and having the frequency of the audio tone signal independent of receiver tuning.

It is still another object of the present invention to provide an improved transistor superheterodyne direction-finder receiver in which a point of minimum signal is easily determined.

These and further objects and advantages of the present invention are achieved, in general, by eliminating the beat intermediate-frequency oscillator and instead applying audio modulation directly to the transistor converter of a superheterodyne receiver. The audio signals amplitude modulate the signal passing through the converter. This modulated signal is then amplified in the IF amplifier, detected, and applied to the audio amplifier of the receiver and appears as an audio tone at the output. A very small audio modulation voltage is effective for this purpose, thereby minimizing overload or feed-through problems. In one embodiment of the invention, the converter is of the self-oscillating type and includes a connection for injecting audio modulation into the emitter electrode of the converter.

Figure 2:
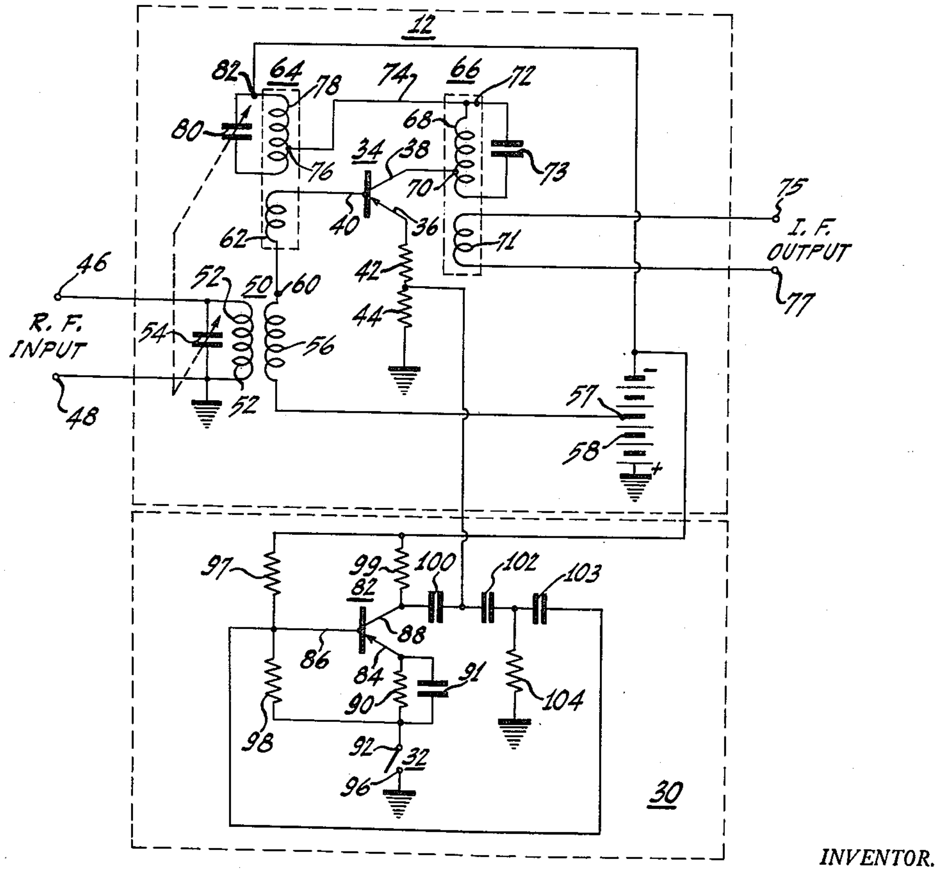

The invention and characteristic embodiments thereof will be described in greater detail by reference to the accompanying drawings, wherein similar reference characters are applied to similar elements, and in which:

FIGURE 1 is a schematic block circuit diagram of a superheterodyne direction-finder receiver embodying the invention, and FIGURE 2 is a schematic circuit diagram of a transistor converter stage and a transister audio oscillator stage embodying the invention.

Referring to FIGURE 1, a superheterodyne direction-finder receiver employing the invention includes a directive antenna 8 which receives radio-frequency or R.F. carrier signals. The carrier may or may not contain audio modulation, depending upon the system of information transmission being employed. The received signal is applied to a radio-frequency amplifier stage 10, connected with the antenna, which amplifies and applies the signal to a converter 12. The converter acts as a combined R.F. local oscillator and mixer and provides at its output an intermediate-frequency signal. The intermediate-frequency output signal from the converter 12 is then applied to a pair of cascaded intermediate-frequency amplifiers 14 and 16 which provide both intermediate-frequency amplification and also bandwith control as desired. The amplified intermediate-frequency signal from the second IF amplifier 16 is then applied to a second detector 18, where audio modulation is recovered from the intermediate-frequency signal by the well known detection process. The detected audio signal is then applied to an audio amplifier 20. Here the audio signal is further amplified and applied to a loudspeaker 22. Although a loudspeaker is illustrated in the drawing, a pair of headphones or the like might also be used.

To aid in obtaining a null indication, as is required in direction finder receivers, a metering system is shown for this purpose. Since a null indication by purely audio means is subjective, the metering system often provides a more reliable null indication. Accordingly, the output of the audio amplifier is applied to a high pass filter 24 to remove low frequency audio modulation components such as hum, which might be present in the audio output signal. The output of the high pass filter is then applied to a rectifier 26. The rectifier provides a D.C. output which is applied to a null meter 28.

The system as described to this point is capable only of providing reception for audio modulated carrier signals. For the system to be responsive to an unmodulated carrier signal, either a BFO or means for applying audio modulation to the carrier signal must be provided. Because of the difficulties heretofore described, the conventional method of coupling a beat-frequency oscillator to the IF amplifier stage, as is used in vacuum tube receivers, is not suitable for a transistor receiver. These difficulties may be overcome, in accordance with the invention, by connecting an audio modulation source, such as an oscillator 30, with the converter 12. The audio oscillator output signals amplitude modulate the converter IF output signal. The audio oscillator is shown connected to the converter by a switch 32 which allows for manually activating or disabling the oscillator as required.

It should be noted that this system does not contain the disadvantages inherent in the conventional beat-frequency oscillator system wherein both a carrier signal and the BFO signal are both applied to an intermediate-frequency amplifier stage. In the sytsem shown, a small amplitude audio modulation voltage is sufficient to audio modulate the converter intermediate-frequency output signal, thereby minimizing the problem of the audio modulation signal being fed back to other stages in the receiver.

The system shown in FIGURE 1 is particularly suited for use in direction-finder receivers. In this system the frequency of the audio output signal from the loudspeaker 22 is independent of receiver tuning because the audio oscillator 30 is operated at a fixed frequency. Therefore, the maximum amplitude of audio output as a function of receiver tuning is indicative of correct tuning for the system. This is not true of the conventional BFO system, wherein the frequency of the audio output signal varies with tuning, thereby making an accurate indication of signal amplitude difficult, since the response of the human ear is not linear over the audio frequency range. This constant audio frequency output with respect to receiver tuning is therefore a distinct advantage of this system when used for obtaining a null indication in a direction finder receiver.

FIGURE 2 shows a schematic circuit diagram of a transistor audio oscillator stage and a self-oscillating transistor converter stage embodying the invention.

The converter stage includes a transistor 34 of the PNP type, having an emitter 36, a collector 38, and a base 40. Radio-frequency carrier signals are applied to a pair of terminals 46 and 48 connected to the primary winding 52 of an input transformer 50. The transformer 50 also includes a secondary winding 56. The radio frequency carrier signals are inductively coupled to the secondary winding 56 and are thereupon applied to the base 40 of the converter transistor 34 through a transformer winding 62. The winding 62 comprises the secondary of a local oscillator transformer 64 and is connected between the base 40 and a terminal 60 of the input transformer secondary winding 56. The winding 62 applies feedback signals from the collector circuit to the base 40 and provides self-oscillation in the converter. By connecting the other terminal of the input transformer secondary winding 56 to a tap 57 on a source of operating potential 58 a negative base bias voltage is applied to the base 40 of the converter transistor 34.

An intermediate-frequency transformer 66 including a primary winding 68 and a secondary winding 71 is connected in the collector circuit of the converter transistor 34, and functions both as a tuned circuit for obtaining an intermediate-frequency output signal and provides a feedback signal which is applied to the local oscillator transformer 64. A capacitor 73 connected in parallel with the primary winding 68 tunes the transformer 66 to the desired intermediate frequency. Intermediate-frequency output signals are obtained from a pair of terminals 75 and 77 connected to the secondary winding of the intermediate-frequency transformer 66.

To provide the proper collector load impedance a tap terminal 70 on the primary winding 68 of the IF transformer 66 is connected to the collector 38 of the converter transistor 34. Another terminal, 72 is connected by a lead 74 to the oscillator transformer 64, which includes a primary winding 78 and the secondary winding 62. The lead 74 is connected to a tap 76 on the primary winding 78. The secondary winding 62 of the oscillator transformer is directly connected in the base circuit of the converter transistor as previously described. The lead 74 provides a feedback path for a portion of the signal appearing across the primary winding 68 of the intermediate-frequency transformer 66. This feedback signal is coupled to the oscillator transformer 64 which thereupon feeds a signal of proper phase to the base 40 of the converter transistor to cause oscillation.

A variable capacitor 80 connected in parallel with the primary winding 78 of the local oscillator transformer 64 tunes the transformer to a frequency such that the local oscillator signal beats with the incoming radio-frequency carrier signal to produce the desired intermediate-frequency signal. Another variable capacitor 54 connected in parallel with the primary winding 52 of the input transformer 50 to tune the input circuit to the desired carrier frequency. The rotors of the variable capacitors 54 and 80 are mechanically ganged so that the local oscillator frequently tracks with the incoming signal frequency so that the desired intermediate-frequency signal is produced. This is standard procedure in a superheterodyne receiver.

To provide operating bias voltage for the collector 38 of the converter transistor 34, another terminal 82 on the primary winding 78 of the local oscillator transformer 64 is connected to the negative terminal of the battery 58. Operating potential is therefore applied to the collector 38 of the transistor 34 through the series path including the transformer winding 78 and 68. A source of negative operating or biasing potential 58 is illustrated, which is proper for the PNP transistors illustrated. However, if NPN transistors are employed, the polarity of the biasing potential will be reversed.

In addition, the transistor 34 is provided with constant emitter current bias through the series connected resistors 42 and 44 connected between the emitter 36 and ground. Accordingly, the emitter 36 is forward biased with respect to the base 40, and the collector 38 is reverse biased with respect to the base as is proper for the operation of a transistor.

In accordance with the invention, a tone source, such as, for example, an audio oscillator 30 is coupled to the converter 12. The audio oscillator shown is of the phase-shift type, although other types may also be used. The phase-shift oscillator comprises a PNP transistor 82 having an emitter 84, a base 86, and a collector 88.

Constant emitter current bias for the transistor 82 is provided by a resistor 90 connected between the emitter 84 and one terminal 92 of the switch 32. The emitter resistor 90 is bypassed by a capacitor 91 to minimize degeneration. The second terminal 96 of the switch is connected to ground. The switch provides means for activating the audio oscillator by connecting both the emitter resistor 90 and a base return resistor 98 to ground when the switch is closed. To provide the proper base bias voltage for the transistor, a resistor 97 is connected between a source of negative bias voltage 58 and the base 86 of the transistor 82, and a base return resistor 98 is connected between the base 86 and one terminal 92 of the switch 32. To provide an output signal a load resistor 99 is connected between the collector electrode 88 and a source of negative bias voltage 58.

It is therefore apparent that the emitter electrode of the transistor 82 is forward-biased with respect to the base and the collector electrode is reverse biased with respect to the base, as is proper for the operation of the transistor.

To provide the required phase-shift between the collector and the base signal voltages necessary to obtain oscillation, a three section resistance-capacitance phase shifting network is employed. One section of the phase shifting network comprises the capacitor 100 and the resistor 44. The capacitor 100 has one terminal connected to the collector 88 of the transistor 82 and the other terminal connected to the ungrounded terminal of the resistor 44. The resistor 44 therefore has multiple functions. It is part of the emitter bias resistor for the converter transistor 34, a leg of one of the phase shift networks for the audio oscillator 30, and in addition provides for injecting the signal from the audio oscillator into the emitter 36 of the converter transistor 34. Another phase shift network is connected in cascade with the first network and comprises a capacitor 102 and a resistor 104. The capacitor 102 has one lead connected between the ungrounded end of the resistor 44, and a second lead connected to one end of the resistor 104. The other end of the resistor 104 is connected to ground. A third network is required to provide the necessary overall phase shift for oscillation and comprises a capacitor 103 and the base return resistor 98. The capacitor 103 has one lead connected to the ungrounded end of the resistor 104 and a second lead connected directly to the base 86 of the transistor 82. The base return resistor 98 therefore serves in addition as the resistive leg of a phase shift network.

Since there is a 180° phase shift between the base and collector signals, the component values in the phase shift networks are adjusted to provide an additional 180° phase shift, or 60° for each resistor-capacitor combination. By feeding the output of the third phase shift network, comprising the capacitor 103 and the base-return resistor 98, back to the base electrode 86 of the transistor 82, oscillation occurs.

In operation, the converter stage 12 oscillates because of the positive feedback from the collector 38 to the base 40. An incoming radio-frequency signal, such as may be provided by the radio-frequency amplifier of a superheterodyne receiver for example, is applied to the terminals 46 and 48 of the transformer 50. The radio-frequency signal is thereupon coupled to the base 40 of the transistor 34 through the secondary winding 56 of the transformer 50 and the secondary winding 78 of the transformer 64. If it is assumed that the radio-frequency input is a carrier which contains no modulation, the audio oscillator stage 30 will then amplitude modulate the carrier upon its passing through the converter. The amplitude modulated signal can then be detected and amplified to provide an audio output signal responsive to the R.F. carrier. By closing the switch 32 the emitter circuit and the base return resistor of the audio oscillator transistor 82 are connected to ground, thereby activating the oscillator. Audio amplitude modulating signals thereby appear across the resistor 44 and are effectively injected into the emitter 36 of the converter transistor 34. This amplitude modulation is thereupon transferred to the incoming radio-frequency carrier signal upon its passing through the converter stage. The resulting audio tone which appears at the receiver output can be employed to provide a null indication in a direction finding receiver or to produce an audible indication of code C-W signals in a communication receiver.

While it will be understood that the circuit specifications may vary according to the design for any particular application, the following circuit specifications are illustrative of a typical embodiment thereof:

| | |
|---|---|
| Capacitors 91, 100, 102 and 103 | 1, .01, .01 and .01 microfarad respectively. |
| Resistors 42, 44, 90, 96, 98, 99 and 104 | 5,600, 10,000, 560, 120,000, 10,000, 5,600 and 3,300 ohms respectively. |
| Battery 58 | 13½ volts. |
| Transistor 34 | RCA–2N247. |
| Transistor 82 | RCA–2N109. |

Therefore, in a superheterodyne receiver, by applying an audio modulating signal to the converter stage as described an improved system is obtained for both null detection in a direction finder receiver and for reception of code modulated C–W signals.

What is claimed is:

1. A direction finder comprising a superheterodyne receiver, means for detecting carrier signals including a semiconductor frequency converter for providing intermediate-frequency signals in response to said carrier signals, said converter comprising a mixer and an oscillator, means for applying tone signals directly to said mixer for modulating said intermediate frequency signals detector to which said tone modulated intermediate frequency signal is applied whereby said tone signal is derived having an amplitude that is a function of the strength of said carrier signals thereby making possible the detection of a null for direction finding purposes, a utilization device, and means for applying said tone signal to said utilization device.

2. A direction finder comprising a superheterodyne receiver, means for detecting carrier signals including a transistor frequency converter for providing intermediate-frequency signals in response to said carrier signals, said transistor including emitter, base and collector electrodes, means for applying audio tone signals to the emitter electrode of said converter for modulating said intermediate frequency signals, a detector to which said tone modulated intermediate frequency signal is applied whereby said tone signal is derived having an amplitude that is a function of the strength of said carrier signals thereby making possible the detection of a null for direction finding purposes, a utilization device, and means for applying said tone signal to said utilization device.

3. A direction finder comprising a superheterodyne receiver, means for detecting carrier signals including a transistor frequency converter for providing intermediate-frequency signals in response to said carrier signals, said transistor including base, emitter and collector electrodes, a source of audio frequency tone signal, means coupling said source to said converter for amplitude-modulating said intermediate-frequency signals, a detector to which said tone modulated intermediate frequency signal is applied whereby said tone signal is derived having an amplitude that is a function of the strength of said carrier signals thereby making possible the detection of a null for direction finding purposes, a utilization device, and means for applying said tone signal to said utilization device.

4. A direction finder comprising a superheterodyne receiver, means for detecting carrier signals including a transistor frequency converter for providing intermediate-frequency signals in response to said carrier signals, said transistor including base, emitter and collector electrodes, a transistor audio frequency oscillator for supplying a tone signal, means coupling said oscillator to said converter emitter electrode for modulating said intermediate-frequency signals, a detector to which said tone modulated intermediate frequency signal is applied whereby said tone signal is derived having an amplitude that is a function of the strength of said carrier signals thereby making possible the detection of a null for direction finding purposes, a utilization device, and means for applying said tone signal to said utilization device.

5. In a superheterodyne signal receiving system adapted for reception of continuous wave signals, the combination comprising; a transistor converter including base, emitter, and collector electrodes; means for applying a radio-frequency carrier signal to the base electrode of said converter transistor; a transistor audio frequency oscillator; and means connecting said audio oscillator with the emitter electrode of said converter for audio modulating said radio-frequency carrier signal upon passing through said converter.

6. In a superheterodyne receiver the combination comprising a converter transistor including base, emitter and collector electrodes, a transformer connected with said base electrode for applying radio-frequency input signals thereto, a transformer connected with the collector electrode of said converter transistor for deriving an output signal therefrom, a feedback path connected between said collector electrode and said base electrode for providing self-oscillation, a source of audio tone signals, and a connection between said emitter electrode and said source of tone signals for applying tone modulation to said converter.

7. In a transistor superheterodyne receiver, the combination comprising, a converter transistor including base, emitter and collector electrodes, a source of operating potential for said transistor, means connecting a first and second resistor in series between said emitter electrode and a point of reference potential, a first, second and third transformer each including primary and secondary windings, means connecting the secondary winding of said first transformer and the secondary winding of said second transformer in series between said base electrode and said source of operating potential, means connecting the primary of said first transformer to a source of radio-frequency signals, means connecting the secondary winding of said third transformer and the secondary winding of said second transformer in series between said collector electrode and said source of operating potential, a transistor phase-shift type audio oscillator, and a connection between said audio oscillator transistor and the junction of said first and second resistors for injecting an audio modulating signal into the emitter of said converter transistor.

8. The combination with a superheterodyne direction-finder receiver of a converter transistor including base, emitter and collector electrodes, means providing a tuned input circuit in the emitter-to-base current path of said transistor, means providing a tuned output circuit in the collector-to-emitter path of said transistor, a feedback path connected between said collector electrode and said base electrode for providing self-oscillation in said transistor converter, a source of audio tone signals, and means connecting said source of audio tone signals into said emitter-to-base current path of said converter transistor.

9. A direction finder comprising a superheterodyne receiver, a mixer, means for applying a received radio signal to said mixer, means for producing local oscillations and for applying them to said mixer whereby intermediate frequency signals are produced, an output circuit for said intermediate frequency signals, means for producing an audio frequency tone signal, means for applying said tone signal directly to said mixer whereby said intermediate frequency is modulated by said tone signal, a detector connected to said output circuit and to which said tone modulated intermediate frequency signal is applied whereby said tone signal is derived having an amplitude that is a function of the strength of said received radio signal, a utilization device, and means for applying said tone signal to said utilization device.

References Cited in the file of this patent

UNITED STATES PATENTS

| | | |
|---|---|---|
| 1,645,560 | Weagant | Oct. 18, 1927 |
| 2,131,109 | Lowell | Sept. 27, 1938 |
| 2,305,614 | Goldstein | Dec. 22, 1942 |
| 2,514,859 | Griffin et al. | July 11, 1950 |
| 2,809,289 | Harris, et al. | Oct. 8, 1957 |
| 2,853,601 | McKenna | Sept. 23, 1958 |
| 2,886,653 | Lin | May 12, 1959 |
| 2,894,126 | Horgan | July 7, 1959 |
| 2,902,598 | Hills | Sept. 1, 1959 |

FOREIGN PATENTS

| | | |
|---|---|---|
| 528,061 | Great Britain | Oct. 22, 1940 |
| 907,665 | Germany | Mar. 29, 1954 |

UNITED STATES PATENT OFFICE

CERTIFICATE OF CORRECTION

Patent No. 3,018,369 January 23, 1962

David D. Holmes

It is hereby certified that error appears in the above numbered patent requiring correction and that the said Letters Patent should read as corrected below.

Column 6, line 28, after "signals" insert -- , a --.

Signed and sealed this 10th day of July 1962.

(SEAL)
Attest:

ERNEST W. SWIDER
Attesting Officer

DAVID L. LADD
Commissioner of Patents